United States Patent [19]

Calabro

[11] 4,019,099
[45] Apr. 19, 1977

[54] CIRCUIT BOARD MOUNTING DEVICE

[76] Inventor: Anthony D. Calabro, 8738 West Chester Pike, Upper Darby, Pa. 19082

[22] Filed: Jan. 15, 1976

[21] Appl. No.: 649,453

[52] U.S. Cl. .................................. 361/399; 211/41
[51] Int. Cl.² .......................................... H02B 1/02
[58] Field of Search ................ 317/161 DH; 211/41

[56] References Cited

UNITED STATES PATENTS 3,231,785   1/1956   Calabro ...................... 317/101 DH Primary Examiner—David Smith, Jr.

[57] ABSTRACT

A track mounting device for printed circuit board includes an elongated channel member of generally U-shaped cross-section, and including intermediate opposed resilient finger means for resiliently gripping the circuit board, as well as opposed intermediate thickened portions for reinforcing the upstanding parallel side walls of the track device. Furthermore, the track mounting device is provided with opposed protrusions disposed at the opposite ends of the side walls and projecting into the space between said side walls. The spacing between the opposed protrusions is less than the spacing between the opposed thickened portions, but greater than the spacing between the opposed resilient fingers. The end protrusions limit the vibration of the printed circuit board at its extremities where vibrations are the greatest, and also prevent the inadvertant insertion into the track of oversized (thickness) printed circuit cards. The protrusions also aid in reinforcing the upstanding side walls of the track mounting device.

12 Claims, 5 Drawing Figures

CIRCUIT BOARD MOUNTING DEVICE

The subject invention relates to a track mounting device for slidably receiving and frictionally holding modular panels, boards, or circuit cards which are adapted to mount circuits such as printed circuits. The track mounting devices of the subject invention are adapted to be mounted, in turn, in a panel rack or cage which is employed in connection with electronic equipment or the like.

It is the primary object of the subject invention to provide a new and improved track mounting device which includes rigid means for limiting the vibration of the circuit board, and in particular means for limiting and dampening vibration of the circuit board at its extremities where the vibrational forces and displacements of the circuit board are at a maximum. In addition, it is an object of the subject invention to provide means in the subject track device to prevent the inadvertent insertion into the track mounting device of oversized circuit boards, to wit, printed circuit cards having a thickness which is greater than the track mounting device is designed to accommodate, in order to efficiently receive and efficiently hold the circuit board.

The track mounting device of the subject invention is designed to slidably receive and frictionally hold a circuit board, and basically comprises an elongated channel member of generally U-shaped cross-section, preferably of unitary construction, and made of a dielectric material such as plastic. Intermediate the length of the parallel side walls of the channel member there is provided a plurality of closed resilient finger means, as well as opposed thickened portions which project into the space between the parallel side walls for reinforcing the side walls against bending. In order to limit and dampen the critical vibrational forces existing at the ends of the printed circuit board, the subject track mounting device is provided with opposed protrusions disposed at the opposite ends of the side walls and projecting into the space between said walls. The spacing between the opposed protrusions at the ends of the mounting device is less than the spacing between the opposed thickened portions intermediate the length of the channel member, but greater than the spacing between the intermediate opposed resilient finger means. By this arrangement the opposed protrusions disposed at the opposite ends of the channel member additionally function as a gauge for preventing the inadvertent insertion of oversized printed circuit cards into the track mounting device. Still further, the protrusions are formed so as to be connected to both the upstanding side walls, as well as the base of the channel member, and thus the protrusions additionally function to reinforce the side walls at the critical end portions of the channel member where vibrations are at a maximum.

These together with other objects and advantages which will become subsequently apparent reside in the details of construction and operation as more fully hereinafter described and claimed, reference being made to the accompanying drawings in which:

Figure 1:
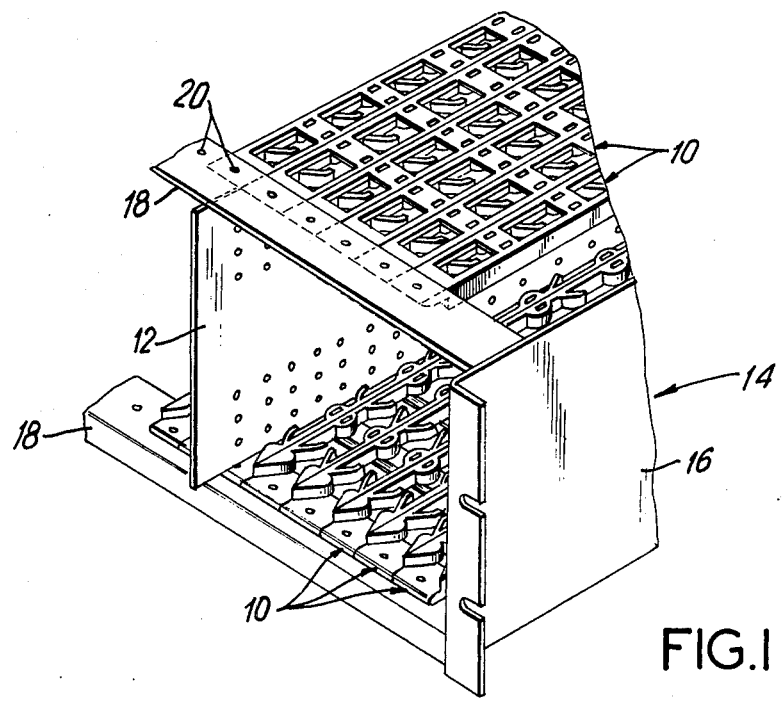
FIG. 1 is a perspective view of a typical installation for a printed circuit board track mounting device made in accordance with the subject invention.

Turning to FIG. 1, the track mounting devices of the subject invention are designated by the numeral 10, and are shown utilized in connection with panel or circuit board 12 which is supported within a cage or panel rack 14. Cage 14 may be of the type which includes end plates 16 that are interconnected by a plurality of channel members 18 which are disposed in parallel relationship, and include apertures 20 for receiving and securing the track mounting devices 10. The circuit boards 12 are inserted into the cage 14 from one side between the parallel spaced channels 18, and are resiliently held in place by means of the track mounting devices 10. The latter are secured to the channel members 18 by means of releasable fasteners which engage the apertures 20. As more fully described hereinafter, the releasable fasteners may be formed as an integral part of the track mounting devices, or alternatively the track mounting devices may also be provided with apertures, and suitable releasable means, such as rivets, screws, etc. may be provided for attaching the track mounting devices 10 to the channel members 18 of the cage 14.

Figure 4:
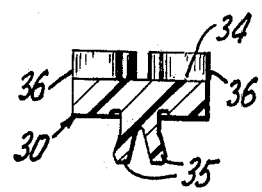
FIG. 4 is a transverse sectional view taken along line 4—4 in FIG. 2.
Figure 5:
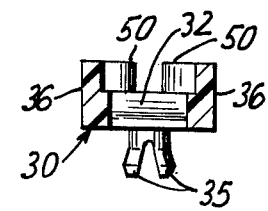
FIG. 5 is a transverse sectional view taken alone line 5—5 in FIG. 2.

Referring now to FIGS. 2 through 5, a preferred embodiment of the subject track mounting device 10 consists of an elongated channel member 30 that is of generally U-shaped cross-section, as more particularly illustrated in FIGS. 4 and 5. Channel member 30 includes a slide bearing base portion 32 from which extends two parallel, upstanding side walls 36, 36. The slide bearing base portion 32 includes longitudinally spaced openings 33, and terminates at end tab portions 34, 34. Contractible fastener elements 35 are formed integral with the end tab portions 34 and are adapted to engage the apertures 20 in the channel members 18 of the cage 14. As an alternate embodiment, the end tab portions 34 may be provided with apertures, and conventional fastening means such as rivets, screws, etc. may be provided for securing the track mounting device to the cage 14.

Figure 2:
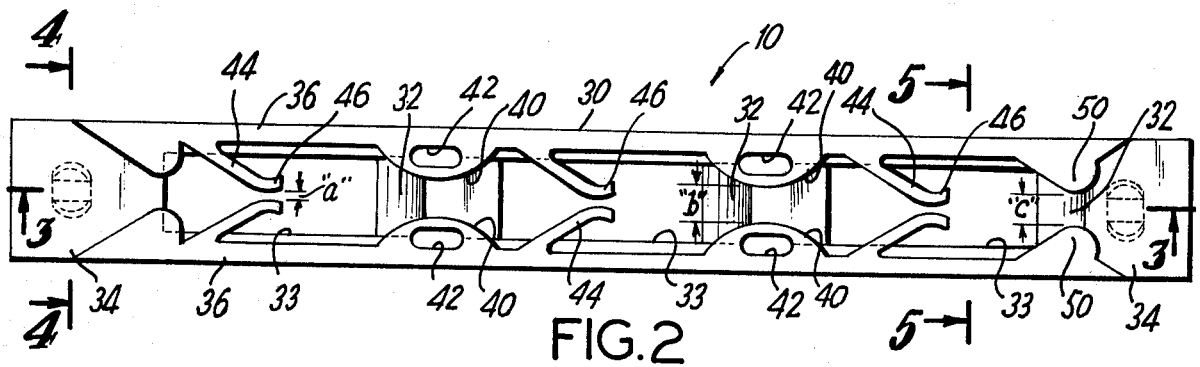
FIG. 2 is a top plan view of the subject track mounting device.
Figure 3:
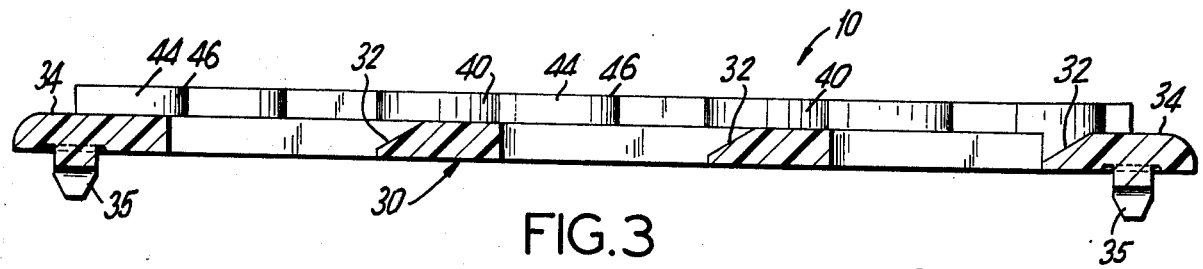
FIG. 3 is a longitudinal sectional view taken along line 3—3 in FIG. 2.

Connected to the slide bearing base portion 32 and formed unitary therewith are the relatively thin parallel spaced side walls 36, 36. Intermediate the length of the channel member 30 the parallel, upstanding side walls 36 are provided with opposed thickened portions 40, 40 that are disposed intermediate spaced openings 33, and which aid in maintaining the upstanding walls 36 rigid. Through the thickened portions 40 of the wall members extend ventilation slots 42 by means of which free circulation of air is permitted over the circuit board 12. As shown in FIG. 2, the openings 33 in the mounting device receive resilient gripping means 44 which are in the form of opposed flexible fingers extending from and unitary with the upstanding walls 36. The resilient finger elements 44 present gripping contact portions 46 in close spaced adjacency to each other centrally within the openings 33 forming a laterally expansible track. In this manner, the flexible finger elements 44 will accommodate circuit boards of varying thicknesses.

In order to limit the vibrational displacements of the circuit board when fully installed and operating, and also to provide means in the track mounting device 10 to prevent the inadvertent insertion of oversized circuit board 12, the channel member 30 is provided at its opposite ends with opposed protrusions, designated by the numeral 50. Each protrusion is preferably formed unitary with its associated side wall 36 and end tab portion 34 whereby the protrusion additionally functions to reinforce and strengthen the upstanding side wall 36. As illustrated in FIG. 2, the spacing between opposed protrusions 50, 50 is designated by the letter $c$, whereas the spacing between the thickened portions 40 intermediate the length of the channel member 30 is designated by the letter $b$. The spacing between the finger elements 44 is designated by the letter $a$. In order to achieve the desired objective of minimizing vibrations of the circuit board at its extremities, and also to provide a gauge for limiting the size of circuit boards to be mounted in the track mounting device, the space $c$ is greater than the space $b$ between the thickened portions 40. On the other hand, the space $c$ is less than the space $a$ between the resilient fingers, yet on the other hand when the fingers are fully extended, they may accommodate circuit boards corresponding to the dimension $c$. As an example, when fingers 44 are designed to accommodate a circuit board 12 having a range of thickness from 0.040 to 0.100 inches, the dimension $c$ may be on the order of 0.100 inches. The spacing $b$ between the opposed thickened portions 40 may be on the order of 0.115 inches. Accordingly, it is readily apparent that the smaller spacing between the protrusions is important in order to limit the vibrational movement of the boards so as to prevent overflexing of the resilient spring fingers, which otherwise would not be achieved by virtue of the spacing between the thickened portions 40. Furthermore, since the thickened portions are located intermediate the ends of the channel member 30, their effectiveness in maintaining the rigidity of the side walls at the critical end locations where vibrations are a maximum is limited; however, this limitation is compensated for in the new and improved track mounting device 10 by virtue of the opposed protrusions 50 which are connected both to the end tab portions 34 and the upstanding side walls 36.

From the foregoing description, the construction and utility of the track mounting device of the present invention will be apparent. It will therefore be appreciated that the molded article forming the track mounting device of the present invention is particularly useful in connection with the locking of circuit boards in place within cages, and may be constructed in varying lengths in accordance with different installation requirements. It will also be appreciated that the flexible self-adjusting contractible fasteners 35 associated with the device 10 eliminates the use of additional fastening means and the need for tools. The protrusions 50 provide the new and improved advantages of an inherent gauge for the track mounting device, additional reinforcement for maintaining the side walls rigid, and most importantly, a means for limiting and dampening the critical vibrations of the circuit board at its extremities where the vibrational stresses are the greatest.

As it is readily apparent, numerous modifications and changes may readily occur to those skilled in the art, and hence it is not desired to limit the invention to the exact construction and operation shown and described, and accordingly all suitable modifications and equivalents may be resorted to, falling within the scope of the invention as claimed. For example, the spring fingers may be opposed, and yet staggered along the length of the channel member, and the slide bearing base portion 32 may be of solid construction without spaced openings, or the thickened portions may be staggered along the length of the channel member, and may be constructed without ventilation slots.

What is claimed is:

1. A track mounting device for slidably receiving and frictionally holding a circuit board comprising an elongated channel member of generally U-shaped cross-section including two parallel side walls and an intermediate slide bearing base portion, opposed resilient grip means projecting from said side walls intermediate the length thereof to form a laterally expansible track in frictional contact with the circuit board supported on the slide bearing base, said side walls including opposed thickened portions projecting into the space between the parallel side walls intermediate the length thereof, and opposed protrusions disposed at opposite ends of the side walls and projecting into the space between said side walls, with the spacing between said opposed protrusions being less than the spacing between said opposed thickened portions but greater than the spacing between said opposed resilient grip means.

2. A track mounting device for slidably receiving and frictionally holding a circuit board as in claim 1 wherein said device is of unitary construction.

3. A track mounting device for slidably receiving and frictionally holding a circuit board as in claim 2 wherein said device is made of a plastic material.

4. A track mounting device for slidably receiving and frictionally holding a circuit board as in claim 1 wherein said opposed thickened portions are provided with ventilation slots extending therethrough.

5. A track mounting device for slidably receiving and frictionally holding a circuit board as in claim 1 wherein said resilient grip means comprises finger elements extending from both of said side walls in opposed relationship into close spaced adjacency to each other.

6. A track mounting device for slidably receiving and frictionally holding a circuit board as in claim 1 wherein said slide bearing base portion includes sliding contact portions longitudinally spaced by openings formed in the elongated channel member, and wherein said opposed protrusions are connected to the end sliding contact portions for reinforcing the side walls.

7. In combination with a circuit board panel and a panel mounting cage having parallel spaced side portions provided with fastener apertures, a track mounting device for slidably receiving and frictionally holding said circuit board comprising an elongated channel member of generally U-shaped cross-section including two parallel side walls and an intermediate slide bearing base portion, said channel member bridging said side portions of the panel mounting cage and having anchoring end portions, said panel including opposed resilient grip means projecting from said side walls intermediate the length thereof to form a laterally expansible track in frictional contact with the circuit board supported on the slide bearing base, said side walls including opposed thickened portions projecting into the space between the parallel said walls intermediate the length thereof, and opposed protrusions disposed at opposite ends of the side walls and projecting into the space between said side walls, with the space between said opposed protrusions being less than the space between said opposed thickened portions but greater than the space between said opposed resilient grip means.

8. The combination of claim 7 wherein said track mounting device is of unitary construction.

9. The combination of claim 7 wherein said track mounting device is made of plastic material.

10. The combination of claim 7 wherein said opposed thickened portions include ventilation slots extending therethrough.

11. The combination of claim 7 wherein said resilient grip means is comprised of finger elements extending from opposed side wall members into close spaced adjacency to each other.

12. The combination of claim 7 wherein said slide bearing base portion is provided with longitudinally spaced openings, and wherein the opposed protrusions connect to the end portions of the slide bearing base to provide reinforcement for the side walls.

* * * * *